(12) United States Patent
Benzel et al.

(10) Patent No.: US 7,572,661 B2
(45) Date of Patent: Aug. 11, 2009

(54) METHOD FOR MANUFACTURING A MICROMECHANICAL SENSOR ELEMENT

(75) Inventors: Hubert Benzel, Pliezhausen (DE);
Stefan Finkbeiner, Gomaringen (DE);
Matthias Illing, Kusterdingen (DE);
Frank Schaefer, Tuebingen (DE);
Simon Armbruster, Gomaringen (DE);
Gerhard Lammel, Tuebingen (DE);
Christoph Schelling, Reutlingen (DE);
Joerg Brasas, Walddorfhaeslach (DE)

(73) Assignee: Robert Bosch GmbH, Stuttgart (DE)

( * ) Notice: Subject to any disclaimer, the term of this patent is extended or adjusted under 35 U.S.C. 154(b) by 369 days.

(21) Appl. No.: 11/223,637

(22) Filed: Sep. 8, 2005

(65) Prior Publication Data

US 2006/0063293 A1 Mar. 23, 2006

(30) Foreign Application Priority Data

Sep. 8, 2004 (DE) .................... 10 2004 043 357

(51) Int. Cl.
*H01L 21/00* (2006.01)
(52) U.S. Cl. ................. 438/53; 257/419; 257/E21.216; 216/99
(58) Field of Classification Search .................... 438/53, 438/753; 257/419, E21.216, E21.233; 216/99
See application file for complete search history.

(56) References Cited

U.S. PATENT DOCUMENTS

| | | | |
|---|---|---|---|
| 6,670,257 B1 | 12/2003 | Barlocchi et al. | |
| 7,045,382 B2 * | 5/2006 | Benzel et al. | 438/50 |
| 7,052,623 B1 * | 5/2006 | Becker et al. | 216/67 |
| 7,276,277 B2 | 10/2007 | Artmann et al. | |
| 7,479,232 B2 | 1/2009 | Benzel et al. | |
| 2002/0086551 A1 * | 7/2002 | Beetz et al. | 438/745 |

(Continued)

FOREIGN PATENT DOCUMENTS

DE 100 30 352 1/2002

(Continued)

*Primary Examiner*—Steven J Fulk
(74) *Attorney, Agent, or Firm*—Kenyon & Kenyon LLP (57) ABSTRACT

Described is a method for manufacturing a micromechanical sensor element and a micromechanical sensor element manufactured in particular using such a method which has a hollow space or a cavity and a membrane for detecting a physical variable. Different method steps are performed for manufacturing the sensor element, among other things, a structured etch mask having a plurality of holes or apertures being applied on a semiconductor substrate. Moreover, an etch process is used to create depressions in the semiconductor substrate beneath the holes in the structured etch mask. Anodization of the semiconductor material is subsequently carried out, the anodization taking place preferably starting from the created depressions in the semiconductor substrate. Due to this process, porous areas are created beneath the depressions, a lattice-like structure made of untreated, i.e., non-anodized, substrate material remaining between the porous areas and the depressions. This lattice-like structure extends preferably from the surface of the semiconductor into the depth. The etch mask for creating the depressions may be removed, optionally prior to or subsequent to the anodization. A temperature treatment is carried out for creating the hollow space and the membrane in the semiconductor substrate which forms the sensor element. During this process, the hollow space is created from the at least one area that has been rendered porous beneath a depression and the membrane above the hollow space is created from the lattice-like structure by rearranging the semiconductor material.

21 Claims, 6 Drawing Sheets

U.S. PATENT DOCUMENTS

2002/0151100 A1* 10/2002 Coffa et al. .................. 438/50
2003/0116813 A1* 6/2003 Benzel et al. ............... 257/414
2004/0152228 A1 8/2004 Benzel et al.

FOREIGN PATENT DOCUMENTS

| | | |
|---|---|---|
| DE | 100 32 579 | 1/2002 |
| DE | 101 14 036 | 10/2002 |
| DE | 102004036035 | 7/2005 |
| EP | 1 043 770 | 10/2000 |
| WO | WO00/23376 * | 4/2000 |
| WO | 02/02458 | 1/2002 |
| WO | WO02/076880 * | 10/2002 |

* cited by examiner

METHOD FOR MANUFACTURING A MICROMECHANICAL SENSOR ELEMENT

FIELD OF THE INVENTION

The present invention is directed to a method for manufacturing a micromechanical sensor element and a micromechanical sensor element.

BACKGROUND INFORMATION

Components having micromechanical sensor elements are frequently used for detecting different physical variables (pressure, temperature, air mass, acceleration, yaw rate), in particular in the automotive industry. Typically, measuring elements on membranes, which are situated above a cavity, are frequently used. For creating the membrane or the cavity, bulk micromechanics, in which the structures are machined out of solid material, are known in addition to surface micromechanics in which layer stacks made up of sacrificial layers and function layers are deposited, structured, and selectively removed.

International Published Patent Application No. 02/02458 and German Published Patent Application No. 100 32 579, for example, describe a method in which different porous areas are formed in a substrate for creating a hollow space beneath the membrane.

It is known from German Published Patent Application No. 100 30 352 to support a membrane above a cavity via stabilization elements. Such stabilization elements are able to be created using etching processes, for example, which selectively remove or porously etch differently doped areas from a substrate as is also described in non-prepublished German Patent Application No. 102004036035 and German Patent Application No. 10358859.

Another possibility for creating a hollow space in a substrate is described in German Published Patent Application No. 101 14 036. In the method described in this publication, an aperture is initially created in the substrate which then undergoes a temperature treatment. Due to the temperature selection and the time period of this temperature, a hollow space is formed in the depth of the substrate under simultaneous closing of the aperture. By using a plurality of adjoining apertures, this method makes it possible to create a membrane with a hollow space situated underneath.

European Published Patent Application No. 1 043 770 describes a method for creating a cavity in which at least one trench is initially created in a substrate via a first etching step. Subsequent to a passivation of the trench walls, the cavity is formed during a second anisotropic etching step. Finally, for forming a membrane above the cavity, a monocrystalline layer is grown on the substrate.

SUMMARY OF THE INVENTION

The present invention is directed to a method for manufacturing a micromechanical sensor element and a micromechanical sensor element, manufactured by such a method and having a hollow space, i.e. a cavity, and a membrane for detecting a physical variable. It is provided that different method steps are carried out for manufacturing the sensor element, among other things, a structured etch mask having a plurality of holes, i.e., apertures, being applied on a semiconductor substrate. In addition, depressions are created in the semiconductor substrate beneath the holes in the structured etch mask via an etching process. The semiconductor material is subsequently anodized, anodizing taking place preferably starting from the created depressions in the semiconductor substrate. This creates porous areas beneath the depressions, a lattice-like structure of untreated, i.e., non-anodized, substrate material remaining between the porous areas and the depressions. This lattice-like structure preferably extends from the surface of the semiconductor substrate into the depth. For creating the depressions, the etch mask may be removed, optionally before or after anodization. A temperature treatment is carried out for creating the hollow space and the membrane in the semiconductor substrate which forms the sensor element. The hollow space is created from the at least one porous area beneath a depression and the membrane above the hollow space is created from the lattice-like structure by rearranging the semiconductor material during the temperature treatment.

By combining etching and anodizing, a dope-free or minimally doped monocrystalline lattice may advantageously be created above a porous layer which may be converted into a membrane or a hollow space via a thermal treatment. Due to the targeted creation of depressions and their penetration depth into the semiconductor substrate, the method according to the present invention makes it possible to form membranes or channels, i.e. hollow spaces, of low thickness tolerance which may be advantageous in pressure measuring or air mass measuring.

According to an embodiment of the present invention, exactly one (sub-) area that has been rendered porous is created beneath each depression in the substrate, the hollow space being formed from a plurality of continuous (sub-) areas that have been rendered porous. A (crystal-) anisotropic etching process, e.g., with KOH or TMAH etching, or a (crystal-) isotropic etching process via a trench etch method may be used for creating the depressions. It may be possible for the trench etch process to have at least one trench cycle, the trench cycle containing at least one trench etching step and one passivation step. The depth of the depression and thus the thickness of the membrane may be predefined by the number of repetitions of a trench cycle during creation of the depression. The vertical dimensions of the hollow spaces, as well as of the membrane covering the hollow spaces, may advantageously be predefined at almost any thickness.

According to a refinement of the present invention, the semiconductor substrate has the same type of doping and/or the same doping concentration at least in the area that has been rendered porous and in the lattice-like structure. The semiconductor substrate may also be doped very minimally or, in the extreme case, may also have a doping concentration equal to zero, i.e., the semiconductor substrate may be completely undoped. In a particular embodiment of the present invention, the formation of the porous area beneath the depression and the formation of the lattice-like structure are independent of the type of doping and the doping concentration.

The semiconductor substrate is immersed in an electrically conductive etching fluid for anodization, the etching fluid having an electrode which is connected to the pole of a voltage source. In contrast to this, the semiconductor substrate is connected to the other pole of the voltage source. The electrode is preferably connected to the negative pole and the substrate to the positive pole of the voltage source, reverse poling also being conceivable with correspondingly selected fluids and substrates.

The dimensions of the porous area, which are created by anodization, may advantageously be predefined by a first time period in which the semiconductor substrate is anodized starting at the depressions. It may also be provided that the first time period for anodization is predefined as a function of the geometric distribution of the holes on the etch mask or the depressions in the substrate. This dependency may be determined, for example, from the mean spacing of the holes or depressions. Moreover, it is also possible to predefine the formation of the lateral and vertical dimensions of the hollow space as a function of the first anodization period.

Further embodiments of the present invention may provide that the temperature treatment of the lattice-like structure above the hollow space results in the formation of a monocrystalline membrane. Moreover, it is conceivable that the hole geometry in the etch mask and thus the distribution of the depressions on the semiconductor substrate is predefined as a function of the crystal structure of the monocrystalline semiconductor substrate. The semiconductor substrate material is preferably only minimally doped or is undoped. An additional layer may optionally be applied, epitactically for example, on the membrane created by the temperature treatment.

Moreover, the proposed membrane manufacturing process may be integrated into a semiconductor process (CMOS or mixed signal) which does not have an epitaxy step. However, an optional epitaxy step may further increase the membrane thickness or may cover the membrane with an additional functional layer. The use of a doping-free substrate in particular makes it possible to combine the method according to the present invention with a circuit process for creating an analyzing circuit. Microelectronic components may also be integrated in the area of the channel, i.e., the hollow space, or the membrane. Due to the creation of a monocrystalline semiconductor membrane or semiconductor hollow space structure, additional advantages in the form of increased mechanical strength may be achieved. In addition, piezo-resistors having a high output factor and emitting a strong measuring signal may be integrated into monocrystalline membranes or lattice or channel structures for analyzing stress applied thereto. The hollow space may also be created via electro polishing, thereby making a rearrangement of the porous material via a thermal process unnecessary. A self-supporting lattice is created directly during the anodization. The presented method makes it generally possible to create a hollow space having any vertical and lateral dimension and any depth.

The use of a trench etch process makes it possible to create deeper depressions so that the hollow space may be created at greater depths. As a result, the thickness of the membrane may be freely selected within wide ranges. An epitaxy step as in the known related art may be dispensed with, thereby making it possible to integrate the process into a semiconductor circuit process which does not involve an epitaxy step, e.g., in a CMOS process.

DETAILED DESCRIPTION

In the present exemplary embodiment, the method according to the present invention is clarified on the basis of the manufacture of a sensor element having a membrane and a hollow space. This sensor element according to the present invention may preferably be used in a pressure sensor; however, use in a mass air flow sensor, a temperature sensor, an acceleration sensor and/or a yaw rate sensor is also conceivable.

Figure 1A:
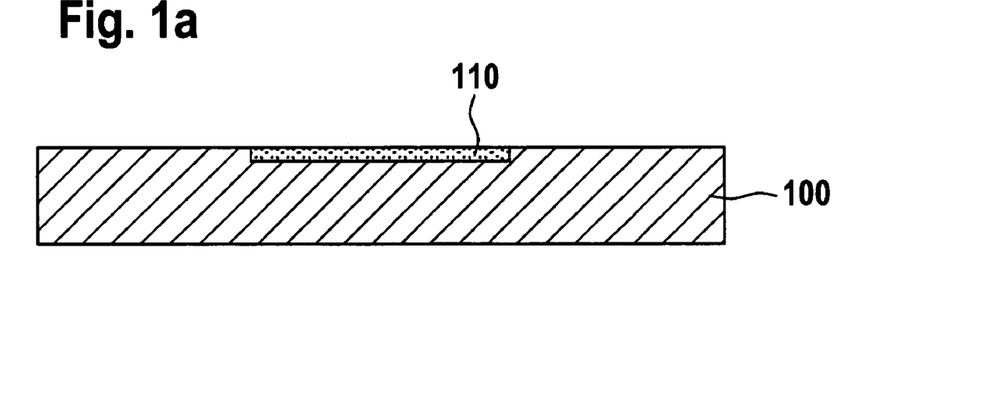
FIGS. 1a through 1c schematically show a process sequence for creating a cavity including a membrane on top of it using porous silicon, as it is known from the related art.
Figure 1B:
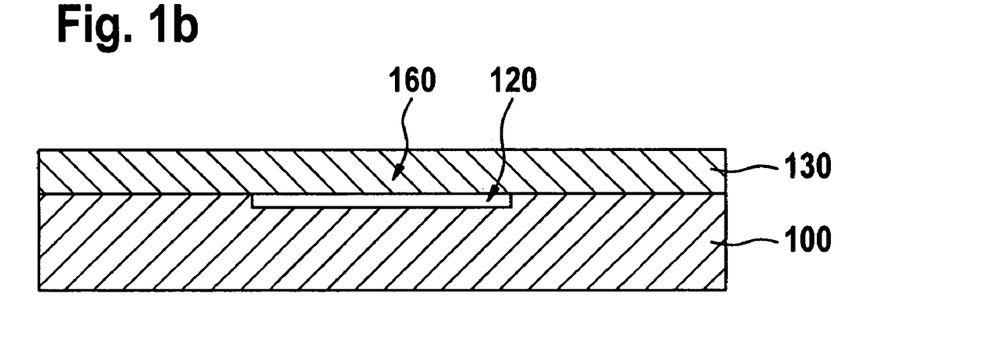
Figure 1C:
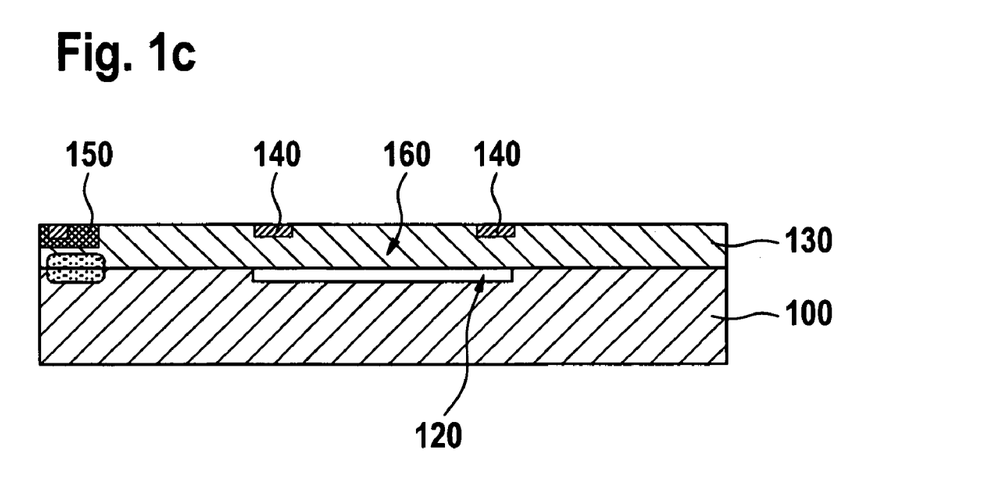

FIGS. 1a through 1c schematically show a known method for creating a membrane above a cavity. The material in a first area 110 of a doped, for example monocrystalline, silicon substrate 100 is either converted into a different type of doping or is provided with a different doping concentration. This area 110 may subsequently be porously etched by an appropriate local the anodization process, the etch process preferably selectively etching the type of doping or the doping concentration existing in area 110. An epitactical layer 130, which may also grow in a monocrystalline manner, may be applied in another method step on the porous silicon in area 110 created in that way. The porous silicon material in area 110 may be rearranged due to the epitaxial conditions or an additional temperature treatment of substrate 100, so that a hollow space 120 is created below epitactical layer 130, a membrane 160 being formed at the same time. Finally, further semiconductor processes may be carried out which, for example, create piezo resistors 140 and/or an analyzing circuit 150 in or on the micromechanical sensor element manufactured in this way.

Figure 2A:
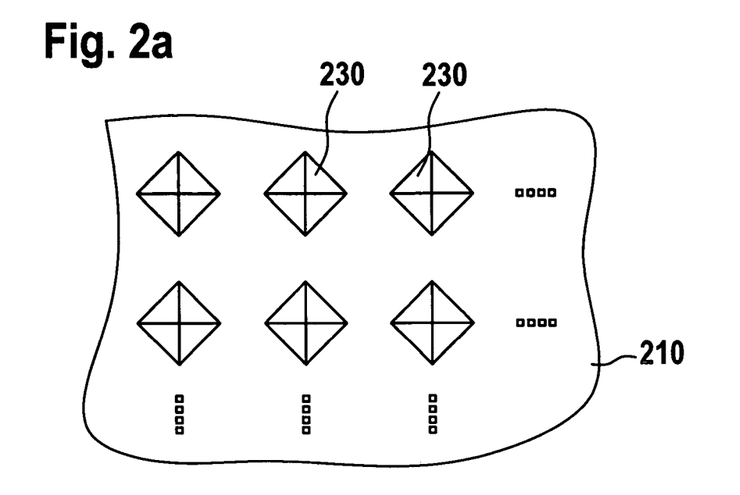
FIGS. 2a through 2f show the method sequence according to the present invention.
Figure 2B:
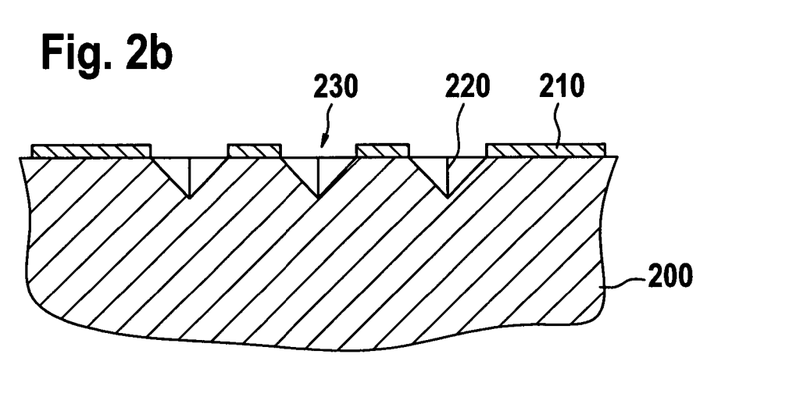
Figure 2C:
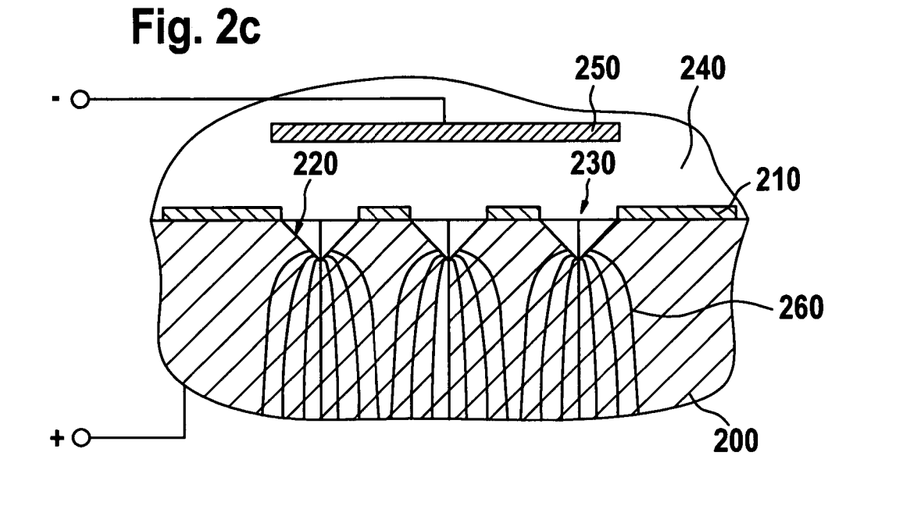
Figure 2D:
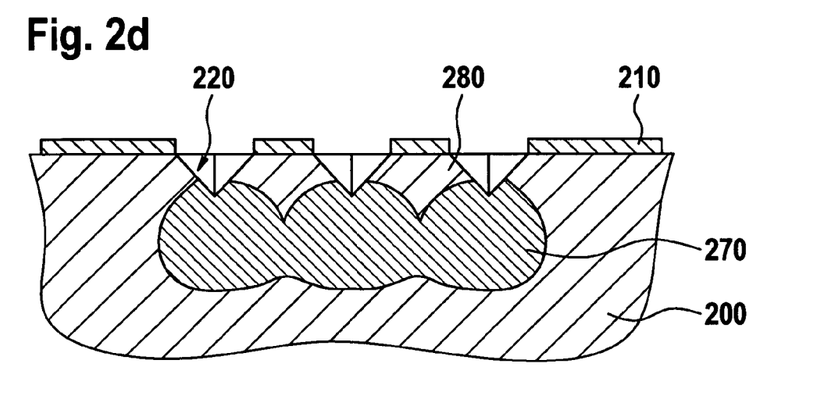
Figure 2E:
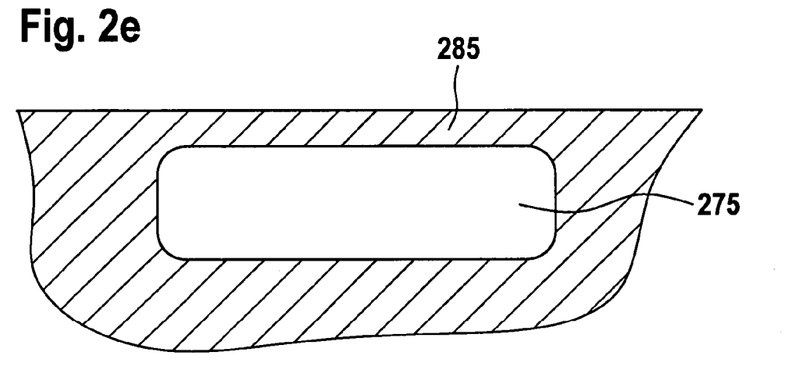
Figure 2F:
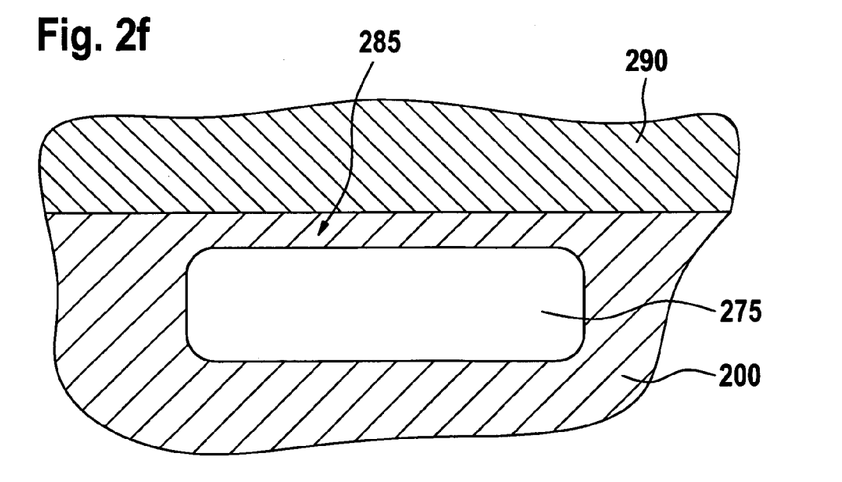

In contrast, special doping or re-doping of the subsequent hollow space area may be dispensed with in the method according to the present invention which is schematically shown in FIGS. 2a through 2f. Moreover, the method is also usable in substrates which are only minimally doped. On a substrate 200, e.g., made of a semiconductor material such as silicon, a suitable (etch) mask 210, e.g., enamel, oxide, or nitride layer(s), is initially created and structured for the subsequent creation of depressions 220 in substrate 200 via an etch process. During structuring of mask 210, holes 230 are created in a uniformly spaced manner, for example, different patterns, e.g., rectangular, diagonal, hexagonal, annular, or lamellar, being conceivable. Moreover, not only the arrangement of the holes is variable, but also the shape of the individual holes. The holes may have a square design (see, among others, the top view in FIG. 2a), a round design (see FIG. 4b), or a rectangular design (see, among others, FIG. 4e) for example. With the aid of etch mask 210, structured in this way, corresponding depressions 220 may be created in silicon substrate 200 via an etch process. FIGS. 2a and 2b show depressions 220 which have been etched into the substrate as typical pyramidal structures via an anisotropic etch process, with KOH or TMAH for example. The pyramid walls of depressions 220 show preferred etch directions in (monocrystalline) silicon substrate 200, the etch front stopping after the pyramidal structures have been etched. After producing depressions 220, pre-etched substrate 200 may be immersed in an electrically conductive etch solution 240 (e.g., hydrofluoric acid) for the anodization. If silicon substrate 200 is now connected to a pole of a voltage source and an electrode 250, which is connected to the other pole of the voltage source, is immersed in electrically conductive solution 240, the anodization may be started since field lines 260 are forming within silicon substrate 200 starting from the points of depressions 220. As FIG. 2c shows, substrate 200 may preferably be connected to the positive potential, whereas electrode 250 in solution 240 is connected to the ground potential. Due to the thus executed anodization, the substrate material beneath depressions 220 may be porously etched so that multiple adjoining porous areas 270 are created, as shown in FIG. 2d. With an increasing time period, in which the anodization is carried out, the porous areas beneath the depressions expand in the lateral as well as vertical direction until multiple adjoining porous areas merge and form one large common porous area. In order to enable targeted merging of the porous areas, the anodization period must be predefined as a function of the geometrical distribution or the mean spacing of depressions 220 and/or holes 230 in etch mask 210. In addition to the spacing of the etch holes, the presence of a possibly existing doping of the substrate also affects the etch result. Due to this anodization process, areas 280, which are not etched and thus correspond to the untreated substrate material, are created between depressions 220. The unetched areas as a whole create a lattice-like structure 280 which, like substrate 200, is monocrystalline and preferably minimally or marginally doped. Removal of etch mask 210 from substrate 200 is followed by a temperature treatment. The silicon material in lattice-like structure 280 as well as in porous area 270 is rearranged during this temperature treatment. Initially pyramid-shaped depressions 220 close and form a preferably monocrystalline membrane 285, while the silicon material in porous area 270 is rearranged to form a closed hollow space 275 beneath the membrane. The points between the individual depressions, as shown in FIG. 2d, are also smoothed out by this temperature treatment, thereby creating a continuous (monocrystalline) membrane 285. An additional material layer 290, made of the same or another material, may optionally be deposited on the micromechanical sensor element produced in this way, using an epitaxy method for example.

Figure 3:
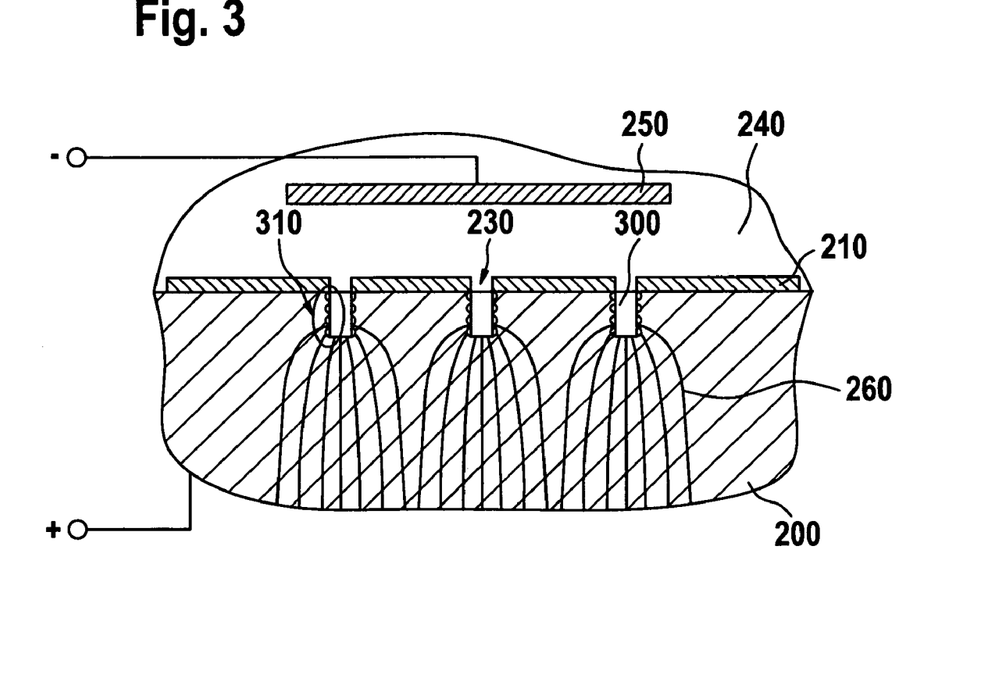
FIG. 3 shows an alternative creation of depressions on which the method according to the present invention is based.

Instead of an anisotropic etch process, such as is used for creating depressions 220 according to FIGS. 2a and 2b, an isotropic etch method or a trench etch method may also be used to create depressions 300. For this purpose, an etch mask 210 is also initially applied on substrate 200 which has holes 230 for creating depressions 300. This etch mask makes it possible to create depressions 300 via at least one trench cycle. Alternately, a trench etch step (e.g., using $SF_6$) and subsequent passivation (e.g., using $C_4F_8$) of the trenched side walls are typically carried out in one trench cycle of a preferred trench etch method such as the RIE method or the DRIE method. A typical indentation is created on the side walls which, during a repetition of the trench cycle, results in a corrugation as shown in FIG. 3 at the edge of depression 300 (see area 310). The selection of repetitions, during which one trench cycle is carried out in each case, makes it possible to adjust the vertical expansion of depression 300 and ultimately the thickness of membrane 285. The anodization takes place in the following according to the above-described method (also compare FIG. 2c).

Deeper depressions may be created when using a trench etch process, so that the hollow space may be created at greater depths, thereby making it possible to freely select the membrane's thickness within a wide range. An epitaxy step as in the known related art may be omitted. This makes it possible to integrate the process into a semiconductor process which does not include an epitaxy step, a CMOS process for example.

Figure 4A:
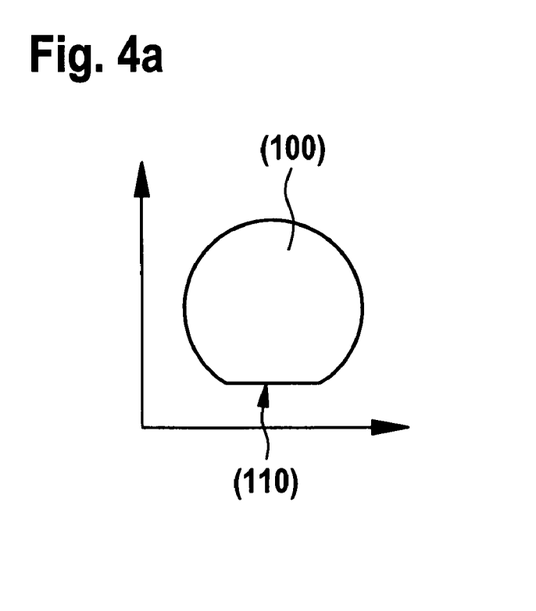
FIGS. 4a through 4f show different aperture geometries, in a position relative to the crystal geometry of the semiconductor substrate, among other things, which may alternatively be used for creating the depressions.
Figure 4B:
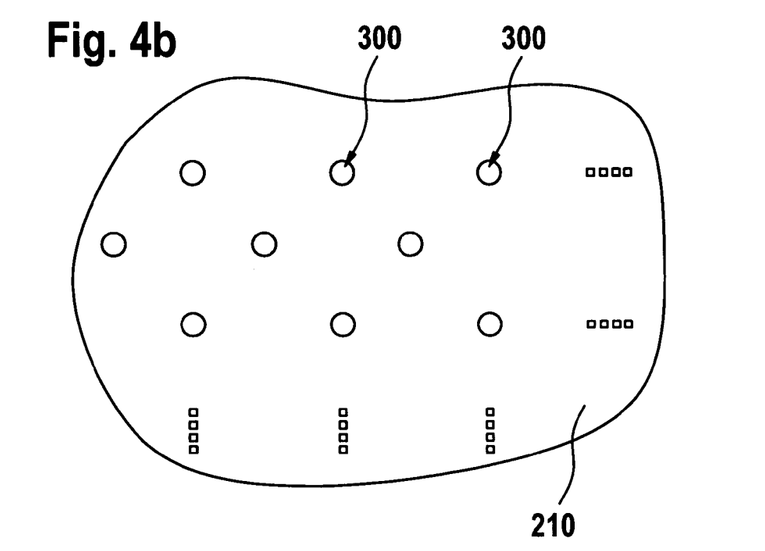
Figure 4C:
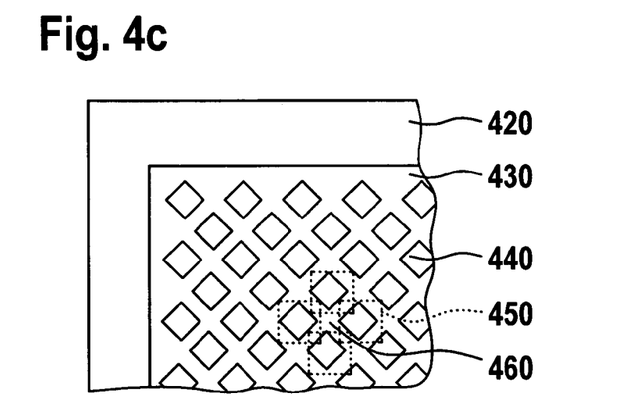
Figure 4D:
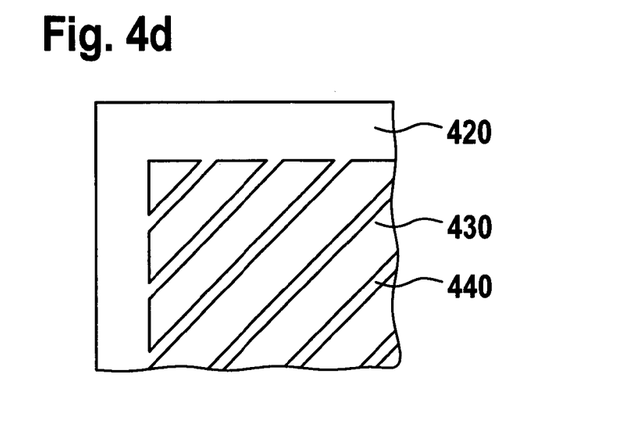
Figure 4E:
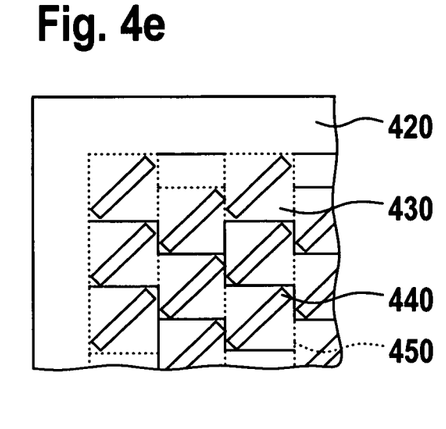

As mentioned above, other geometrical distributions or designs for creating the depressions, as shown in FIGS. 2a, 4b, 4c, 4d, 4e, and 4f, may be selected in addition to the arrangement of holes 230 in etch mask 210. Moreover, the hole geometry or the orientation of the anodization process may be adjusted to certain crystal structures of the substrate or a wafer. It is conceivable, for example, that a wafer, as shown in FIG. 4a, is used for manufacturing the sensor element according to the present invention, the wafer having a surface area with a (100) orientation and a side surface with a (110) orientation. The hole geometry and the etch processes may be correspondingly adjusted, in order to enable optimal merging of the porous areas beneath the depressions.

Figure 4F:
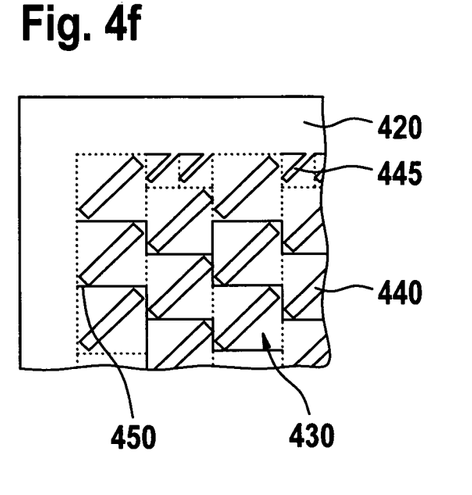

FIG. 4c shows a top view of a substrate which has a membrane edge 420, a lattice-like structure 430, and etch holes 440. (Crystal) anisotropic underetching takes place through etch holes 440, e.g., using KOH or TMAH, so that adjacent areas overlap. Places 460 may be created between the underetched areas which, with particular control of the etch process, are also supported. FIG. 4f shows a modification of the hole geometry shown in FIG. 4e. The use of additional etch apertures 445 enables more uniform underetching on the membrane edge and thus better edge support. The lattice-like structures in FIGS. 4c through 4f may generally be used in porously etched areas as well as in areas etched using KOH or TMAH. In addition to the use for the method according to the present invention, the proposed hole geometries of FIGS. 4b through 4f may also be used for creating a hollow space or a membrane involving doped substrate material, as they are described in German Patent Application No. 102004036035 and German Published Patent Application No. 10358859, for example. The etch apertures may be sealed by applying another material layer as well as via a temperature treatment.

Figure 5A:
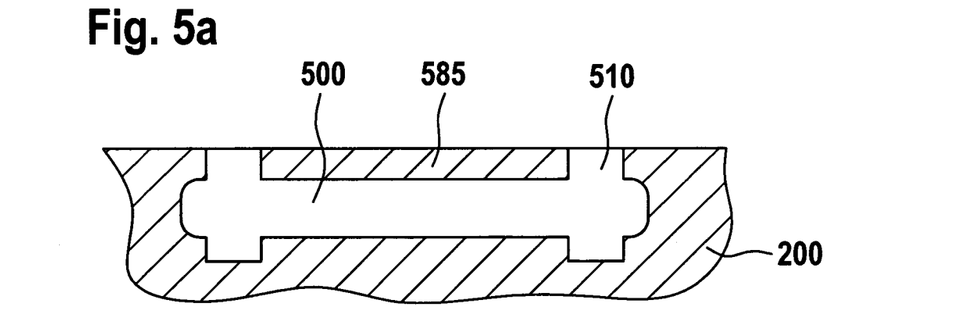
FIGS. 5a and 5b show other applications of the method according to the present invention for creating a channel.
Figure 5B:
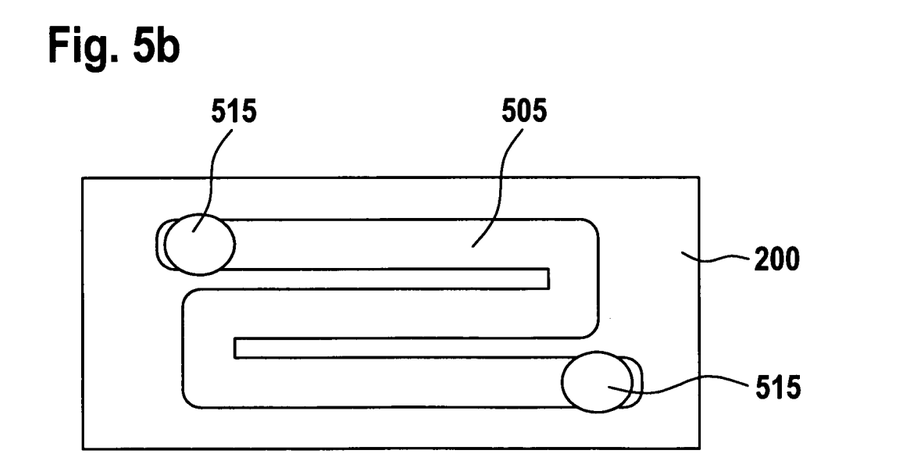

The method according to the present invention is used in a further exemplary embodiment to create channels 500, as shown in FIG. 5a, which are buried by membranes 585. Such channels may be created, for example, in that holes 230 are correspondingly situated side by side so that a continuous oblong hollow space is created by underetching. These channels 500 may have one or multiple access apertures 510 which may be additionally created in the membrane and thus in the substrate after the temperature treatment and thus after sealing of the etch apertures and formation of membrane 585. As a particular design, FIG. 5b shows a wave form of a thus created buried channel 505 in substrate 200 which may also be formed by suitable arrangements of holes 230 and in which two access apertures 515 are provided. Via these access apertures, for example, a medium may be routed through the channel.

What is claimed is:

1. A method for manufacturing a micromechanical sensor element having a hollow space and a membrane, comprising:
   applying a structured etch mask having a plurality of holes on a semiconductor substrate;
   creating depressions beneath the holes via an etch process;
   forming, via anodization, an area rendered porous beneath at least one of the depressions in the semiconductor substrate and a lattice-like structure, made of a substrate material that has not been rendered porous, on a surface of the semiconductor substrate between the depressions;
   removing the etch mask; and
   creating the hollow space out of the area rendered porous and the membrane above the hollow space out of the lattice-like structure via one of a temperature treatment and an electro polishing of the semiconductor substrate;
   wherein the semiconductor substrate has the same doping concentration in both the area rendered porous and the lattice-like structure, and
   wherein a formation of the area rendered porous beneath and a formation of the lattice-like structure are doping-independent.

2. The method as recited in claim 1, further comprising:
creating an electro-polished area beneath each depression in the semiconductor substrate, the hollow space being created by a plurality of continuous electro-polished areas.

3. The method as recited in claim 1, wherein at least one of:
the etch process is one of an isotropic etch process and an anisotropic etch process,
the etch process includes one of KOH, TMAH, and a trench etch process, and
the etch process stops by itself after etching of an inverse pyramid.

4. The method as recited in claim 3, wherein:
the etch process has at least one trench cycle,
the trench cycle has a trench etch step and a passivation process, and
a depth of the depression and a thickness of the membrane is predefinable as a function of a number of executed trench cycles during the creation of the depression.

5. The method as recited in claim 1, further comprising:
for anodization, immersing the semiconductor substrate in an electrically conductive etch fluid, wherein the etch fluid includes an electrode connected to a negative pole of a voltage source; and
connecting the semiconductor substrate to a positive pole of the voltage source.

6. The method as recited in claim 5, wherein the electrically conductive etch fluid includes hydrofluoric acid.

7. The method as recited in claim 1, wherein:
dimensions of the area rendered porous in the semiconductor substrate are predefinable via a first anodization period,
the first anodization period is predefined as a function of a geometrical distribution of the holes in the etch mask, and
the hollow space is formed as a function of the first anodization period.

8. The method as recited in claim 1, further comprising at least one of:
forming a monocrystalline membrane above the hollow space, a hole geometry on the etch mask being predefinable as a function of a crystal structure of the semiconductor substrate;
minimally doping the substrate material; and
applying an additional layer on the membrane.

9. The method as recited in claim 8, wherein the additional layer includes an epitactical layer.

10. The method as recited in claim 1, further comprising:
completely burying the hollow space in the semiconductor substrate; and
creating at least two feed-through apertures in the membrane, so that a channel is formed in the semiconductor substrate.

11. A method for manufacturing a micromechanical sensor element having a hollow space and a membrane, comprising:
applying a structured etch mask having a plurality of holes on a semiconductor substrate;
creating depressions beneath the holes via an etch process;
forming, via anodization, an area rendered porous beneath at least one of the depressions in the semiconductor substrate and a lattice-like structure, made of a substrate material that has not been rendered porous, on a surface of the semiconductor substrate between the depressions;
removing the etch mask; and
creating the hollow space out of the area rendered porous and the membrane above the hollow space out of the lattice-like structure via one of a temperature treatment and an electro polishing of the semiconductor substrate;
creating an electro-polished area beneath each depression in the semiconductor substrate, the hollow space being created by a plurality of continuous electro-polished areas;
wherein at least one of: the etch process is one of an isotropic etch process and an anisotropic etch process, the etch process includes one of KOH, TMAH, and a trench etch process, and the etch process stops by itself after etching of an inverse pyramid,
wherein the semiconductor substrate has the same doping concentration in both the area rendered porous and the lattice-like structure, and
wherein a formation of the area rendered porous beneath and a formation of the lattice-like structure are doping-independent.

12. The method as recited in claim 11, wherein:
the etch process has at least one trench cycle,
the trench cycle has a trench etch step and a passivation process, and
a depth of the depression and a thickness of the membrane is predefinable as a function of a number of executed trench cycles during the creation of the depression.

13. The method as recited in claim 11, further comprising:
for anodization, immersing the semiconductor substrate in an electrically conductive etch fluid, wherein the etch fluid includes an electrode connected to a negative pole of a voltage source; and
connecting the semiconductor substrate to a positive pole of the voltage source.

14. The method as recited in claim 13, wherein the electrically conductive etch fluid includes hydrofluoric acid.

15. The method as recited in claim 11, wherein:
dimensions of the area rendered porous in the semiconductor substrate are predefinable via a first anodization period,
the first anodization period is predefined as a function of a geometrical distribution of the holes in the etch mask, and
the hollow space is formed as a function of the first anodization period.

16. The method as recited in claim 11, further comprising at least one of:
forming a monocrystalline membrane above the hollow space, a hole geometry on the etch mask being predefinable as a function of a crystal structure of the semiconductor substrate;
minimally doping the substrate material; and
applying an additional layer on the membrane.

17. The method as recited in claim 16, wherein the additional layer includes an epitactical layer.

18. The method as recited in claim 11, further comprising:
completely burying the hollow space in the semiconductor substrate; and
creating at least two feed-through apertures in the membrane, so that a channel is formed in the semiconductor substrate.

19. The method as recited in claim 11, further comprising:
for anodization, immersing the semiconductor substrate in an electrically conductive etch fluid, wherein the etch fluid includes an electrode connected to a negative pole of a voltage source; and
connecting the semiconductor substrate to a positive pole of the voltage source;
wherein:

dimensions of the area rendered porous in the semiconductor substrate are predefinable via a first anodization period, the first anodization period is predefined as a function of a geometrical distribution of the holes in the etch mask, and the hollow space is formed as a function of the first anodization period.

20. The method as recited in claim 11, further comprising:

completely burying the hollow space in the semiconductor substrate;

creating at least two feed-through apertures in the membrane, so that a channel is formed in the semiconductor substrate; and at least one of:

forming a monocrystalline membrane above the hollow space, a hole geometry on the etch mask being predefinable as a function of a crystal structure of the semiconductor substrate;

minimally doping the substrate material; and applying an additional layer on the membrane.

21. A method for manufacturing a micromechanical sensor element having a hollow space and a membrane, comprising:

applying a structured etch mask having a plurality of holes on a semiconductor substrate;

creating depressions beneath the holes via an etch process;

forming, via anodization, an area rendered porous beneath at least one of the depressions in the semiconductor substrate and a lattice-like structure, made of a substrate material that has not been rendered porous, on a surface of the semiconductor substrate between the depressions;

removing the etch mask;

creating the hollow space out of the area rendered porous and the membrane above the hollow space out of the lattice-like structure via one of a temperature treatment and an electro polishing of the semiconductor substrate; and creating an electro-polished area beneath each depression in the semiconductor substrate, the hollow space being created by a plurality of continuous electro-polished areas;

wherein at least one of: the etch process is one of an isotropic etch process and an anisotropic etch process, the etch process includes one of KOH, TMAH, and a trench etch process, and the etch process stops by itself after etching of an inverse pyramid, and wherein:

the etch process has at least one trench cycle, the trench cycle has a trench etch step and a passivation process, a depth of the depression and a thickness of the membrane is predefinable as a function of a number of executed trench cycles during the creation of the depression, the semiconductor substrate has the same doping concentration in both the area rendered porous and the lattice-like structure, and a formation of the area rendered porous beneath and a formation of the lattice-like structure are doping-independent.

* * * * *

UNITED STATES PATENT AND TRADEMARK OFFICE
CERTIFICATE OF CORRECTION

PATENT NO. : 7,572,661 B2 Page 1 of 1
APPLICATION NO. : 11/223637
DATED : August 11, 2009
INVENTOR(S) : Benzel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 706 days.

Signed and Sealed this

Seventh Day of September, 2010

David J. Kappos
*Director of the United States Patent and Trademark Office*